US010892260B2

United States Patent
Chen et al.

(10) Patent No.: US 10,892,260 B2
(45) Date of Patent: Jan. 12, 2021

(54) CAPACITOR

(71) Applicant: HIMAX TECHNOLOGIES LIMITED, Tainan (TW)

(72) Inventors: Ping-Liang Chen, Tainan (TW); Chao-Liang Chien, Tainan (TW); Shih-Yi Tang, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 97 days.

(21) Appl. No.: 16/293,638

(22) Filed: Mar. 6, 2019

(65) Prior Publication Data

US 2020/0286885 A1 Sep. 10, 2020

(51) Int. Cl.
| | |
|---|---|
| *H01L 27/06* | (2006.01) |
| *H01L 27/24* | (2006.01) |
| *H01L 49/02* | (2006.01) |
| *H03K 17/687* | (2006.01) |
| *H03K 19/00* | (2006.01) |

(52) U.S. Cl.
CPC ...... *H01L 27/0629* (2013.01); *H01L 27/2436* (2013.01); *H01L 27/2463* (2013.01); *H01L 28/40* (2013.01); *H03K 17/6872* (2013.01); *H03K 19/0027* (2013.01)

(58) Field of Classification Search
CPC . H01L 27/0629; H01L 27/2463; H01L 28/40; H01L 27/2436; H03K 17/6872; H03K 19/0027
USPC .................................................. 327/376, 427
See application file for complete search history.

(56) References Cited

U.S. PATENT DOCUMENTS

| | | | | |
|---|---|---|---|---|
| 4,453,090 A | * | 6/1984 | Sempel ............... | H01L 27/0805 257/300 |
| 5,576,565 A | * | 11/1996 | Yamaguchi ......... | H01L 27/0805 257/296 |
| 6,608,365 B1 | * | 8/2003 | Li ....................... | H01L 27/0811 257/204 |
| 7,508,696 B2 | * | 3/2009 | Komaki .............. | H01L 27/0682 365/149 |
| 7,705,654 B2 | * | 4/2010 | Rong ................. | H03K 19/0963 327/376 |
| 9,438,225 B1 | * | 9/2016 | Yeung ................ | H01L 27/0629 |
| 2001/0015449 A1 | | 8/2001 | Nguyen et al. | |
| 2002/0135044 A1 | | 9/2002 | Tille et al. | |
| 2005/0062523 A1 | * | 3/2005 | Wang .................. | H03J 1/0008 327/554 |

(Continued)

OTHER PUBLICATIONS

"Office Action of Taiwan Counterpart Application," dated Sep. 4, 2019, p. 1-p. 4.

*Primary Examiner* — Ryan Jager
(74) *Attorney, Agent, or Firm* — JCIPRNET (57) ABSTRACT

A capacitor includes a first transistor, a second transistor, and a control circuit. The first terminal of the first transistor is coupled to the first terminal of the capacitor. The first terminal of the second transistor is coupled to the second terminal of the capacitor. In a normal mode, the control circuit turns on the first transistor and the second transistor, the second terminal of the second transistor is coupled to the control terminal of the first transistor through the control circuit, and the control terminal of the second transistor is coupled to the second terminal of the first transistor through the control circuit. In a power saving mode, the control circuit turns off the first transistor and the second transistor.

12 Claims, 11 Drawing Sheets

(56) References Cited

U.S. PATENT DOCUMENTS

| | | | |
|---|---|---|---|
| 2007/0045770 A1* | 3/2007 | Aoki | H01L 29/78 |
| | | | 257/516 |
| 2009/0207552 A1* | 8/2009 | Frederick, Jr. | H01G 4/35 |
| | | | 361/306.2 |
| 2009/0243658 A1* | 10/2009 | Yokoi | H01L 27/0629 |
| | | | 326/102 |

* cited by examiner

FIG. 20 ic
CAPACITOR

BACKGROUND

Technical Field

The disclosure relates to a capacitor.

Description of Related Art

Capacitors are often widely used in integrated circuits. For example, a capacitor coupled between a system voltage rail and a ground voltage rail may be used as a decoupling capacitor. A decoupling capacitor has a function of stabilizing voltage.

In integrated circuits, methods of implementation of some capacitors are using transistors such as a Metal-Oxide-Semiconductor Field-Effect Transistor (MOSFET). For instance, when an N-channel Metal-Oxide-Semiconductor (NMOS) transistor is used as a capacitor, the gate of the NMOS transistor is directly coupled to a system voltage rail, and the drain and source of the NMOS transistor are directly coupled to a ground voltage rail. When a P-channel Metal-Oxide-Semiconductor (PMOS) transistor is used as a capacitor, the drain and source of the PMOS transistor are directly coupled to a system voltage rail, and a gate of the PMOS transistor is directly coupled to a ground voltage rail. In any case, when a scenario of electrostatic discharge (ESD) occurs to the power rail (a system voltage rail or a ground voltage rail), ESD current is likely break down the gate of the transistor and burn down the transistor because the gate of the transistor is directly coupled to the power rail.

SUMMARY

The disclosure provides a capacitor to increase the protection capability to electrostatic discharge (ESD) and to reduce leakage current in a power saving mode.

One embodiment of the disclosure provides a capacitor. The capacitor includes a first transistor, a second transistor and a control circuit. A first terminal of the first transistor is used to couple to a first terminal of the capacitor. A first terminal of the second transistor is used to couple to a second terminal of the capacitor. The control circuit is coupled between the first transistor and the second transistor. In a power saving mode, the control circuit turns off the first transistor and the second transistor. In a normal mode, the control circuit turns on the first transistor and the second transistor, a second terminal of the second transistor is coupled to a control terminal of the first transistor through the control circuit, and a control terminal of the second transistor is coupled to a second terminal of the first transistor through the control circuit.

Based on the above, in the capacitor of the embodiments of the disclosure, the control terminals of the first transistor and the second transistor are not directly coupled to the first terminal and the second terminal of the capacitor, so as to increase the protection capability to ESD. When the system is in a power saving mode, the control circuit may turn off the first transistor and the second transistor, so as to reduce leakage current.

In order to make the features and advantages of the disclosure mentioned above more understandable, embodiments will be described in detail below with reference to the accompanying drawings.

BRIEF DESCRIPTION OF THE DRAWINGS

The accompanying drawings are included to provide a further understanding of the invention, and are incorporated in and constituted a part of this specification. The drawings illustrate embodiments of the invention and, together with the description, serve to explain the principles of the invention.

DESCRIPTION OF THE EMBODIMENTS

The term "coupled to" (or connected to) used in the entire content of the specification of the disclosure may refer to any direct or indirect means. For instance, if the content describes that a first device is coupled to (or connected to) a second device, it should be explained that the first device may be directly connected to the second device, or the first device may be indirectly connected to the second device through other devices or some methods for connection. In addition, in every possible situation, the elements, components or steps that use the same reference numerals in the FIGs and embodiments represent the same or similar parts. The elements, components or steps that use the same reference numerals or the same terms in different embodiments may refer to relevant explanations mutually.

Figure 1:
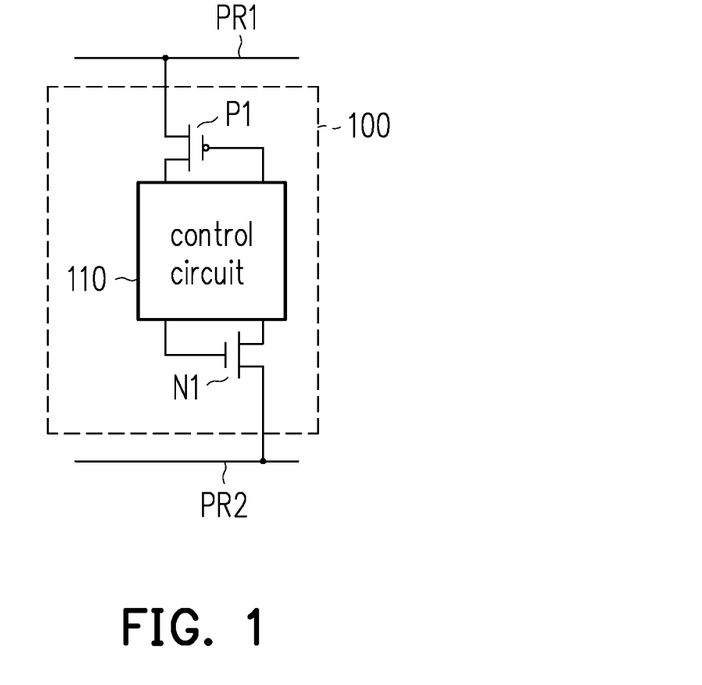
FIG. 1 is a schematic view of a circuit block of a capacitor drawn according to an embodiment of the disclosure.

FIG. 1 is schematic view of a circuit block of a capacitor 100 drawn according to an embodiment of the disclosure. In the embodiment shown by FIG. 1, a first terminal of the capacitor 100 is coupled to a power rail PR1, and a second terminal of the capacitor 100 is coupled to a power rail PR2. According to the design requirements, in some embodiments, the power rail PR1 may transmit system voltage (system voltage VDD for instance), and the power rail PR2 may transmit reference voltage (ground voltage VSS for instance). In some other embodiments, the power rail PR1 may transmit the reference voltage, and the power rail PR2 may transmit the system voltage.

In any case, the applications of the capacitor 100 should not be limited to the embodiment shown by FIG. 1. Any capacitors in electrical circuits may implement by referring to the capacitor 100 shown by FIG. 1.

The capacitor 100 includes a transistor P1, a transistor N1 and a control circuit 110. When the transistor P1 is one of an N-channel Metal-Oxide-Semiconductor (NMOS) transistor and a P-channel Metal-Oxide-Semiconductor (PMOS) transistor, and the transistor N1 is the other one of the NMOS transistor and the PMOS transistor. For instance, in the embodiment shown by FIG. 1, the transistor P1 is a PMOS transistor, and the transistor N1 is an NMOS transistor. According to the design requirements, in other embodiments, the transistor P1 may be an NMOS transistor, and the transistor N1 may be a PMOS transistor.

A first terminal (a source for instance) of the transistor P1 is coupled to a first terminal of the capacitor 100. A first terminal (a source for instance) of the transistor N1 is coupled to a second terminal of the capacitor 100. The control circuit 110 is coupled between the transistor P1 and the transistor N1. In a normal mode, a second terminal (a drain for instance) of the transistor N1 is coupled to a control terminal (a gate for instance) of the transistor P1 through the control circuit 110, and a control terminal (a gate for instance) of the transistor N1 is coupled to a second terminal (a drain for instance) of the transistor P1 through the control circuit 110.

The control circuit 110 is coupled to a control terminal of the transistor P1 and a control terminal of the transistor N1. In a power saving mode, the control circuit 110 turns off the transistor P1 through a control signal S1; and turns off the transistor N1 through a control signal S2. Since the transistor P1 and the transistor N1 are turned off, leakage current of the capacitor 100 may be effectively reduced.

In the normal mode, the control circuit 110 may turn on the transistor P1 and the transistor N1. The embodiment does not limit the turn-on mechanism of the transistor P1 and the transistor N1. For instance, in some embodiments, the control circuit 110 may turn on the transistor P1 through the control signal S1, and turn on the transistor N1 through the control signal S2. In some other embodiments, the control circuit 110 may not output the control signals S1 and S2 in a normal mode, which means that the output of the control circuit 110 is in a floating state. When the output of the control circuit is in a floating state, the positive charge of the control terminal of the transistor P1 drains to the power rail PR2 through the transistor N1, which means that the voltage of the control terminal of the transistor P1 may be pulled down. Thus, when the output of the control circuit 110 is in a floating state, the transistor P1 and the transistor N1 are turned on.

It should be noticed that the gates of the transistor P1 and the transistor N1 are not directly coupled to the first terminal and the second terminal of the capacitor 100; therefore, it is more difficult for the ESD current to break down the gate of a transistor (having better protection capability to ESD). When the system is in a power saving mode, the control circuit 110 may turn off the transistor P1 and the transistor N1 to reduce leakage current.

According to different design requirements, the implementation of the block of the control circuit 110 may be hardware, firmware and software (known as "program") or combination forms of a plurality of the aforementioned three elements. In a form of hardware, the abovementioned block of the control circuit 110 may be implemented in a logic circuit on an integrated circuit. The abovementioned relevant functions of the control circuit 110 may be implemented as the hardware by using hardware description languages (such as Verilog HDL or VHDL) or other suitable programming language. For instance, the abovementioned relevant functions of the control circuit 110 may be implemented in one or a plurality of logical blocks, modules and/or circuits.

Figure 2:
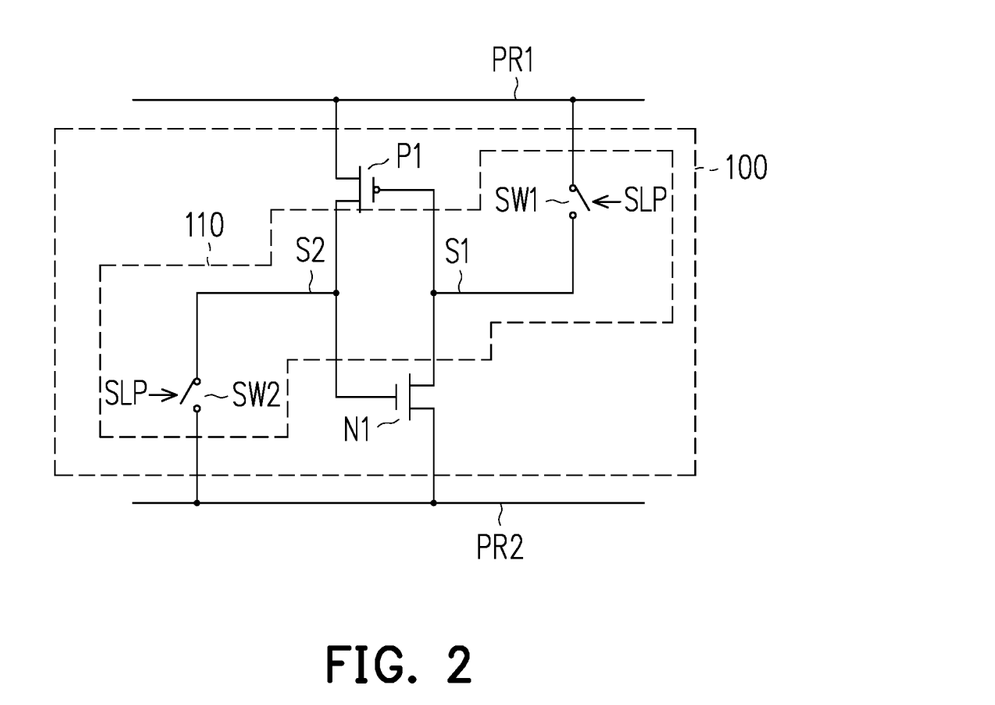
FIG. 2 is a schematic view of a circuit block of a control circuit shown by FIG. 1 according to the explanation of an embodiment of the disclosure.

FIG. 2 is a schematic view of a circuit block of the control circuit 110 shown by FIG. 1 according to an embodiment of the disclosure. In the embodiment shown by FIG. 2, the control circuit 110 includes a switch SW1 and a switch SW2. A first terminal of the switch SW1 is coupled to a first voltage. According to design requirements, the first voltage may be any voltage that is capable of turning off the transistor P1. For instance, in the embodiment shown by FIG. 2, the first voltage may be the system voltage (a system voltage VDD for instance) of the power rail PR1. A second terminal of the switch SW1 is coupled to the control terminal of the transistor P1. The switch SW1 is controlled by a sleep signal SLP. The sleep signal SLP may be a control signal transmitted by a system controller (not shown in the drawings). When the sleep signal SLP is a first logic level (representing that the system is in a sleep mode or a power saving mode), the switch SW1 is turned on. When the switch SW1 is turned on, the first voltage may turn off the transistor P1. When the sleep signal SLP is a second logic level (representing that the system is in a normal mode), the switch SW1 is turned off.

A first terminal of the switch SW2 is coupled to the second voltage. According to the design requirements, the second voltage may be any voltage that is capable of turning off the transistor N1. For instance, in the embodiment shown by FIG. 2, the second voltage may be the reference voltage (a ground voltage VSS for instance) of the power rail PR2. A second terminal of the switch SW2 is coupled to the control terminal of the transistor N1. The switch SW2 is controlled by the sleep signal SLP. When the sleep signal SLP is a first logic level (representing that the system is in the sleep mode or the power saving mode), the switch SW2 is turned on. When the switch SW2 is turned on, the second voltage may turn off the transistor N1. When the sleep signal SLP is the second logic level (representing that the system is in the normal mode), the switch SW2 is turned off.

Figure 3:
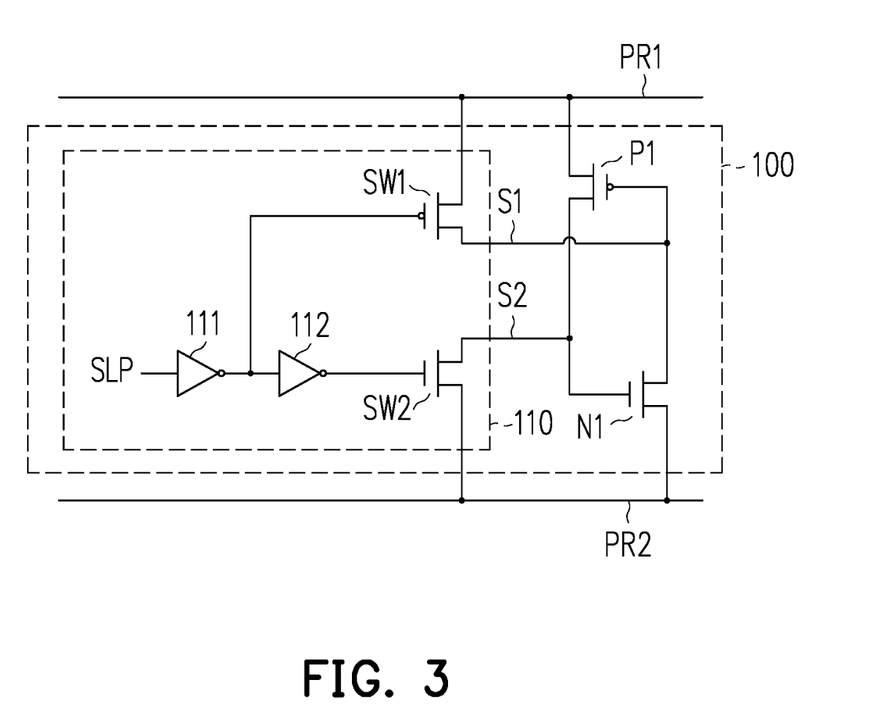
FIG. 3 is a schematic view of a circuit block of a control circuit shown by FIG. 1 according to the explanation of another embodiment of the disclosure.

FIG. 3 is a schematic view of a circuit block of the control circuit 110 shown by FIG. 1 according to another embodiment of the disclosure. In the embodiment shown by FIG. 3, the control circuit 110 includes a switch SW1, a switch SW2, an NOT gate 111 and an NOT gate 112. The switch SW1 and the switch SW2 shown by FIG. 3 may be analogized referring the relevant description of the switch SW1 and the switch SW2 shown by FIG. 2, and therefore will be not described again. In the embodiment shown by FIG. 3, the switch SW1 includes a PMOS transistor, and the switch SW2 includes an NMOS transistor.

An input terminal of the NOT gate 111 is used to receive a sleep signal SLP. The sleep signal SLP may be a control signal transmitted by the system controller (not shown in the drawings). When the sleep signal SLP is a first logic level (a high logic level for instance), it means that the system is in a sleep mode or a power saving mode. When the sleep signal SLP is a second logic level (a low logic level for instance), it means that the system is in a normal mode. An output terminal of the NOT gate 111 is coupled to a gate of the PMOS transistor (the switch SW1). An input terminal of the NOT gate 112 is coupled to the output terminal of the NOT gate 111. An output terminal of the NOT gate 112 is coupled to a gate of the NMOS transistor (the switch SW2).

Figure 4:
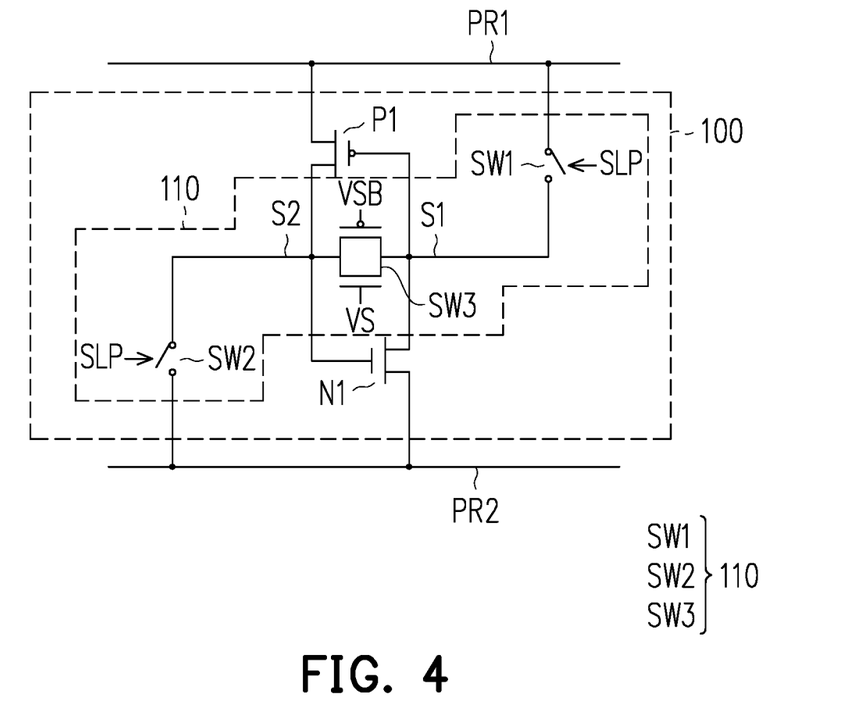
FIG. 4 is a schematic view of a circuit block of the control circuit shown by FIG. 1 according to another embodiment of the disclosure.

FIG. 4 is a schematic view of a circuit block of the control circuit 110 shown by FIG. 1 according to another embodiment of the disclosure. In the embodiment shown by FIG. 4, the control circuit 110 includes the switch SW1, the switch SW2 and a switch SW3. The switch SW1 and the switch SW2 shown in FIG. 4 can be analogized with reference to the related description of FIG. 2 or FIG. 3, and therefore will not be described again. The first terminal of the switch SW3 is couple to the control terminal of the transistor P1. The second terminal of the switch SW3 is coupled to the control terminal of the transistor N1. The switch SW3 is turned on during a charge sharing period of the power saving mode. The transistor P1 and the transistor N1 are turned off during a power saving period of the power saving mode after the charge sharing period. The switch SW3 is turned off in the normal mode.

The implementation of switch SW3 can be determined according to design requirements. For example, in the embodiment shown in FIG. 4, the switch SW3 may include a transmission gate. The first terminal of the transmission gate is couple to the control terminal of the transistor P1. The second terminal of the transmission gate is coupled to the control terminal of the transistor N1. The control terminal of the transmission gate is controlled by a short-circuit control signal VS, and the inverting control terminal of the transmission gate is controlled by the short-circuit control signal VSB, wherein the short-circuit control signal VSB is an inverted signal of the short-circuit control signal VS.

The capacitor 100 with the switch SW3 enhances the performance in the power saving mode. If the short-circuit control signal VS is high, the loop of capacitor 100 is weaken (i.e., the voltage level of the control terminal of the transistor N1 is pulled down from the system voltage VDD to VDD/2, and the voltage level of the control terminal of the transistor P1 is pulled up from the ground voltage VSS to VDD/2) because the control terminal of the transistor N1 and the control terminal of the transistor P1 are shorted together by the switch SW3. If the short-circuit control signal VS goes high before that the switch SW1 and the switch SW2 are turned on, the control terminals of the transistors N1 and P1 will be pulled to ground voltage VSS and system voltage VDD faster, respectively, because the switch SW1 and the switch SW2 dis-charge or charge half power to the control terminals of the transistors N1 and P1. In some application, the capacitance of the capacitor 100 is very large, and the switch SW3 helps to improve the performance of the transistors N1 and P1 during disabling the capacitor 100.

Figure 5:
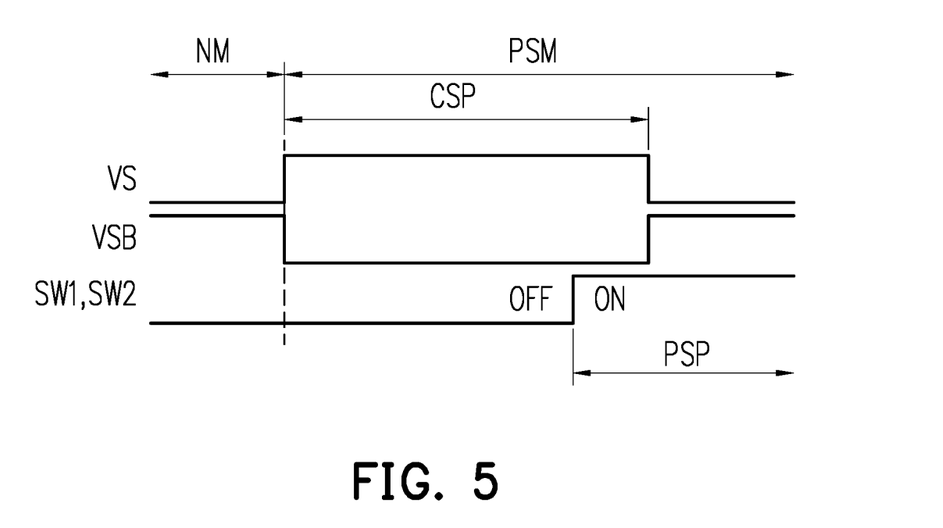
FIG. 5 is a timing diagram of the operational state of the switches illustrated in FIG. 4 according to an embodiment of the disclosure.

FIG. 5 is a timing diagram of the operational state of the switches illustrated in FIG. 4 according to an embodiment of the disclosure. The horizontal axis shown in FIG. 5 represents time, and the vertical axis represents signal level. In the normal mode NM, the switch SW1, the switch SW2 and the switch SW3 are turned off. The switch SW3 is turned on during a charge sharing period CSP of the power saving mode PSM. After the end of the charge sharing period CSP, the switch SW3 is turned off. The switch SW1 and the switch SW2 are turned on (i.e., the transistor P1 and the transistor N1 are turned off) during a power saving period PSP of the power saving mode PSM after the charge sharing period CSP.

Figure 6:
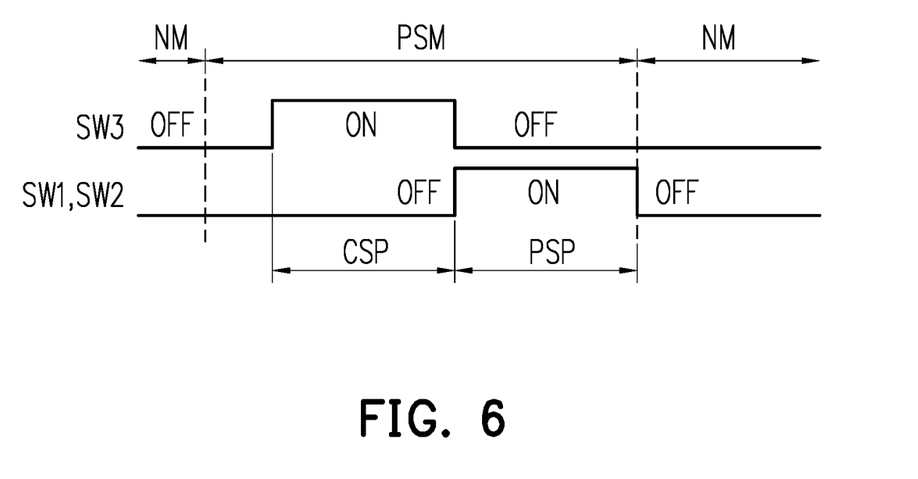
FIG. 6 is a timing diagram of the operational state of the switches illustrated in FIG. 4 according to another embodiment of the disclosure.

FIG. 6 is a timing diagram of the operational state of the switches illustrated in FIG. 4 according to another embodiment of the disclosure. The horizontal axis shown in FIG. 6 represents time, and the vertical axis represents signal level. In the normal mode NM, the switch SW1, the switch SW2 and the switch SW3 are turned off. The switch SW1 and the switch SW2 are turned off and the switch SW3 is turned on during the charge sharing period CSP of the power saving mode PSM. The switch SW1 and the switch SW2 are turned on (i.e., the transistor P1 and the transistor N1 are turned off) and the switch SW3 is turned off during the power saving period PSP of the power saving mode PSM after the charge sharing period CSP.

Figure 7:
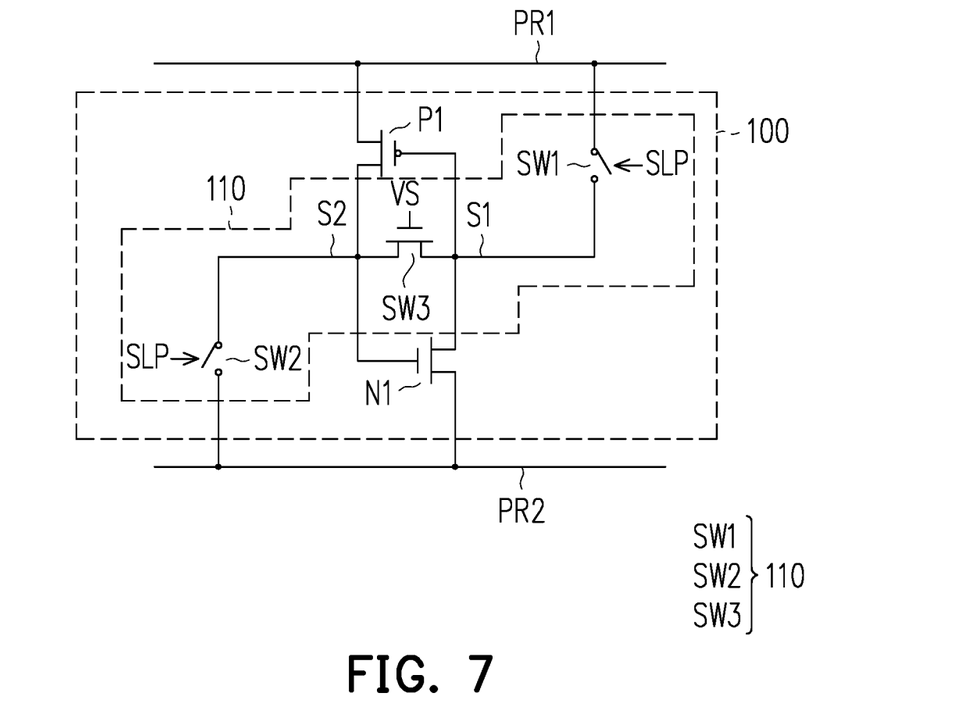
FIG. 7 is a schematic view of a circuit block of the control circuit shown by FIG. 1 according to another embodiment of the disclosure.

FIG. 7 is a schematic view of a circuit block of the control circuit 110 shown by FIG. 1 according to another embodiment of the disclosure. In the embodiment shown by FIG. 7, the control circuit 110 includes the switch SW1, the switch SW2 and the switch SW3. The switch SW1 and the switch SW2 shown in FIG. 7 can be analogized with reference to the related description of FIG. 2 or FIG. 3, the switch SW3 shown in FIG. 7 can be analogized with reference to the related description of FIG. 4 to FIG. 6, and therefore will not be described again. In the embodiment shown in FIG. 7, the switch SW3 may include a transistor. The first terminal of the transistor is couple to the control terminal of the transistor P1. The second terminal of the transistor is coupled to the control terminal of the transistor N1. The control terminal of the transistor is controlled by the short-circuit control signal VS.

Figure 8:
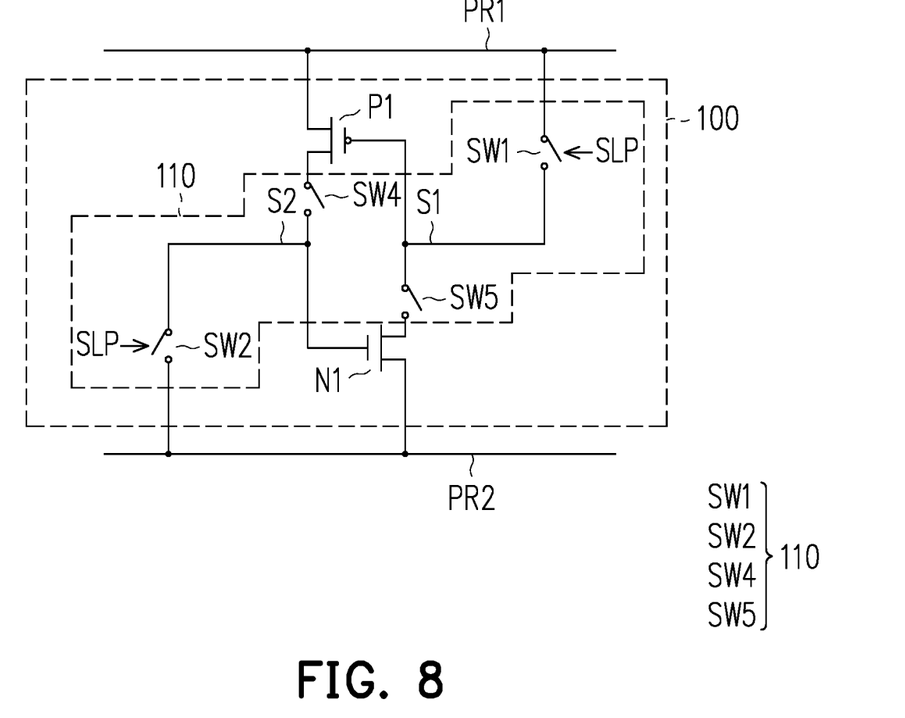
FIG. 8 is a schematic view of a circuit block of the control circuit shown by FIG. 1 according to another embodiment of the disclosure.

FIG. 8 is a schematic view of a circuit block of the control circuit 110 shown by FIG. 1 according to another embodiment of the disclosure. In the embodiment shown by FIG. 8, the control circuit 110 includes the switch SW1, the switch SW2, a switch SW4 and a switch SW5. The switch SW1 and the switch SW2 shown in FIG. 8 can be analogized with reference to the related description of FIG. 2 or FIG. 3, and therefore will not be described again.

The switch SW4 is coupled between the second terminal of the transistor P1 and the control terminal of the transistor N1 (i.e., the first terminal of the switch SW4 is coupled to the second terminal of the transistor P1, and the second terminal of the switch SW4 is coupled to the control terminal of the transistor N1). The switch SW5 is coupled between the control terminal of the transistor P1 and the second terminal of the transistor N1 (i.e., the first terminal of the switch SW5 is coupled to the second terminal of the transistor N1, and the second terminal of the switch SW5 is coupled to the control terminal of the transistor P1). The switch SW4 and the switch SW5 are turned on in the normal mode NM, and the switch SW4 and the switch SW5 are turned off in the power saving mode PSM.

The switch SW4 and the switch SW5 help to improve the performance of the transistors N1 and P1 during disabling the capacitor 100. If the switch SW4 and the switch SW5 are turned off before that the switch SW1 and the switch SW2 are turned on, the control terminals of the transistors N1 and P1 will be pulled to ground voltage VSS and system voltage VDD faster, respectively. In other embodiments, one of switch SW4 and the switch SW5 may be omitted, depending on design requirements.

Figure 9:
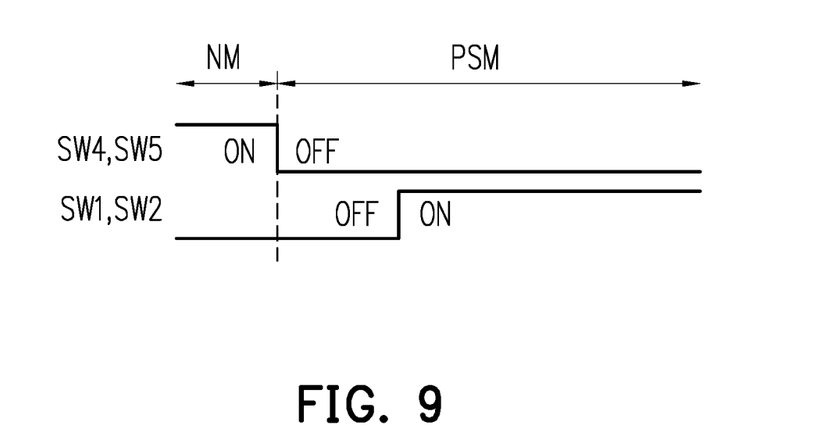
FIG. 9 is a timing diagram of the operational state of the switches illustrated in FIG. 8 according to an embodiment of the disclosure.

FIG. 9 is a timing diagram of the operational state of the switches illustrated in FIG. 8 according to an embodiment of the disclosure. The horizontal axis shown in FIG. 9 represents time, and the vertical axis represents signal level. The switch SW1 and the switch SW2 are turned off and the switch SW4 and the switch SW5 are turned on in the normal mode NM. The switch SW4 and the switch SW5 are turned off in the power saving mode PSM. After the switch SW4 and the switch SW5 are turned off, the switch SW1 and the switch SW2 are turned on in the power saving mode PSM.

Figure 10:
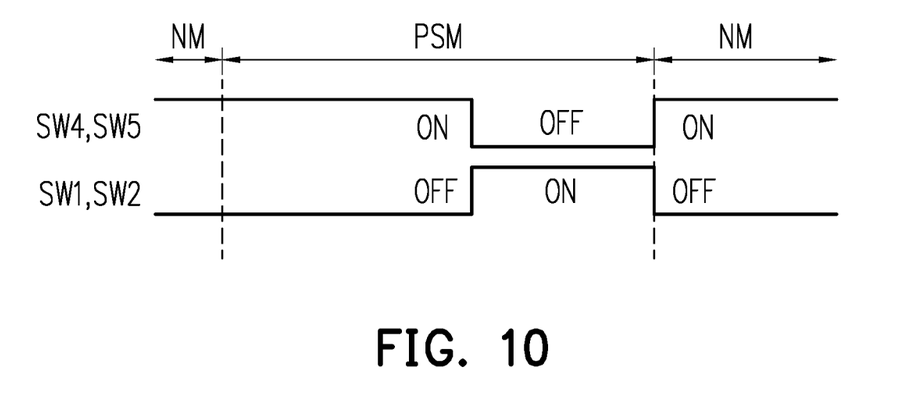
FIG. 10 is a timing diagram of the operational state of the switches illustrated in FIG. 8 according to another embodiment of the disclosure.

FIG. 10 is a timing diagram of the operational state of the switches illustrated in FIG. 8 according to another embodiment of the disclosure. The horizontal axis shown in FIG. 10 represents time, and the vertical axis represents signal level. In the normal mode NM, the switch SW1 and the switch SW2 are turned off, and the switch SW4 and the switch SW5 are turned on. The switch SW1 and the switch SW2 are turned on (i.e., the transistor P1 and the transistor N1 are turned off) and the switch SW4 and the switch SW5 are turned off in the power saving mode PSM.

Figure 11:
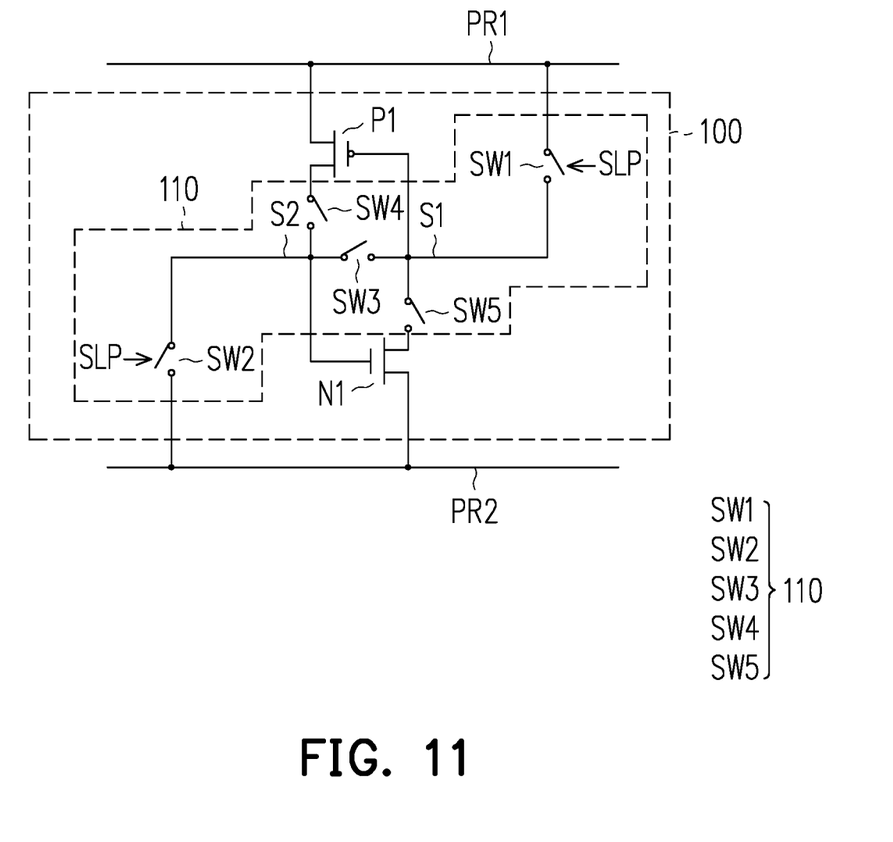
FIG. 11 is a schematic view of a circuit block of the control circuit shown by FIG. 1 according to another embodiment of the disclosure.

FIG. 11 is a schematic view of a circuit block of the control circuit 110 shown by FIG. 1 according to another embodiment of the disclosure. In the embodiment shown by FIG. 11, the control circuit 110 includes the switch SW1, the switch SW2, the switch SW3, the switch SW4 and the switch SW5. The switch SW1 and the switch SW2 shown in FIG. 11 can be analogized with reference to the related description of FIG. 2 or FIG. 3, the switch SW3 shown in FIG. 11 can be analogized with reference to the related description of FIG. 4 to FIG. 7, the switch SW4 and the switch SW5 shown in FIG. 11 can be analogized with reference to the related description of FIG. 8 to FIG. 10, and therefore will not be described again.

Figure 12:
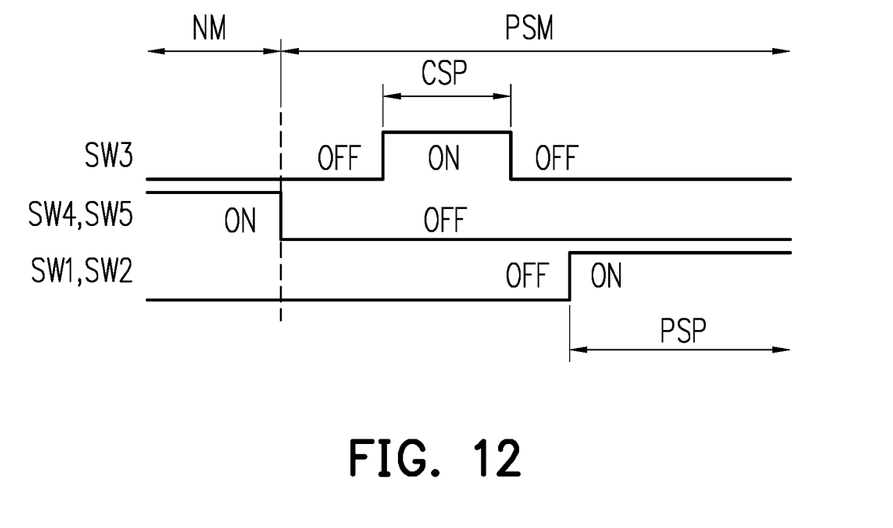
FIG. 12 is a timing diagram of the operational state of the switches illustrated in FIG. 11 according to an embodiment of the disclosure.

FIG. 12 is a timing diagram of the operational state of the switches illustrated in FIG. 11 according to an embodiment of the disclosure. The horizontal axis shown in FIG. 12 represents time, and the vertical axis represents signal level. In the normal mode NM, the switch SW1, the switch SW2 and the switch SW3 are turned off, and the switch SW4 and the switch SW5 are turned on. The switch SW4 and the switch SW5 are turned off in the power saving mode PSM. After the switch SW4 and the switch SW5 are turned off, the switch SW1, the switch SW2 and the switch SW3 can be turned on in the power saving mode PSM. For example, the switch SW1 and the switch SW2 are turned off and the switch SW3 is turned on during the charge sharing period CSP of the power saving mode PSM, and the switch SW1 and the switch SW2 are turned on and the switch SW3 is turned off during the power saving period PSP of the power saving mode PSM after the charge sharing period CSP.

Figure 13:
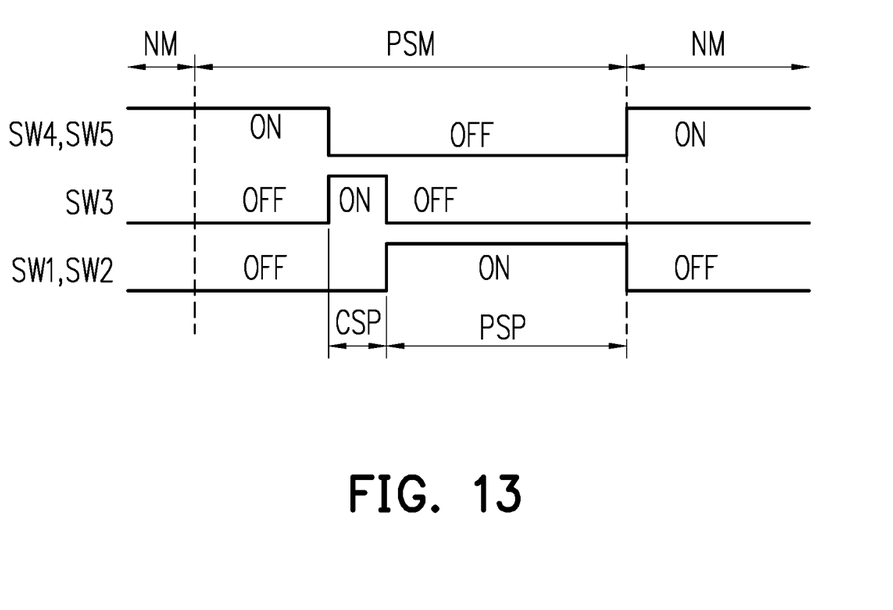
FIG. 13 is a timing diagram of the operational state of the switches illustrated in FIG. 11 according to another embodiment of the disclosure.

FIG. 13 is a timing diagram of the operational state of the switches illustrated in FIG. 11 according to another embodiment of the disclosure. The horizontal axis shown in FIG. 13 represents time, and the vertical axis represents signal level. In the normal mode NM, the switch SW1, the switch SW2 and the switch SW3 are turned off, and the switch SW4 and the switch SW5 are turned on. After the end of the normal mode NM, the switch SW4 and the switch SW5 are turned off in the power saving mode PSM. During that the switch SW4 and the switch SW5 are turned off, the switch SW3 is turned on in the charge sharing period CSP of the power saving mode PSM, and the switch SW1 and the switch SW2 are turned on and the switch SW3 is turned off during the power saving period PSP of the power saving mode PSM after the charge sharing period CSP.

Figure 14:
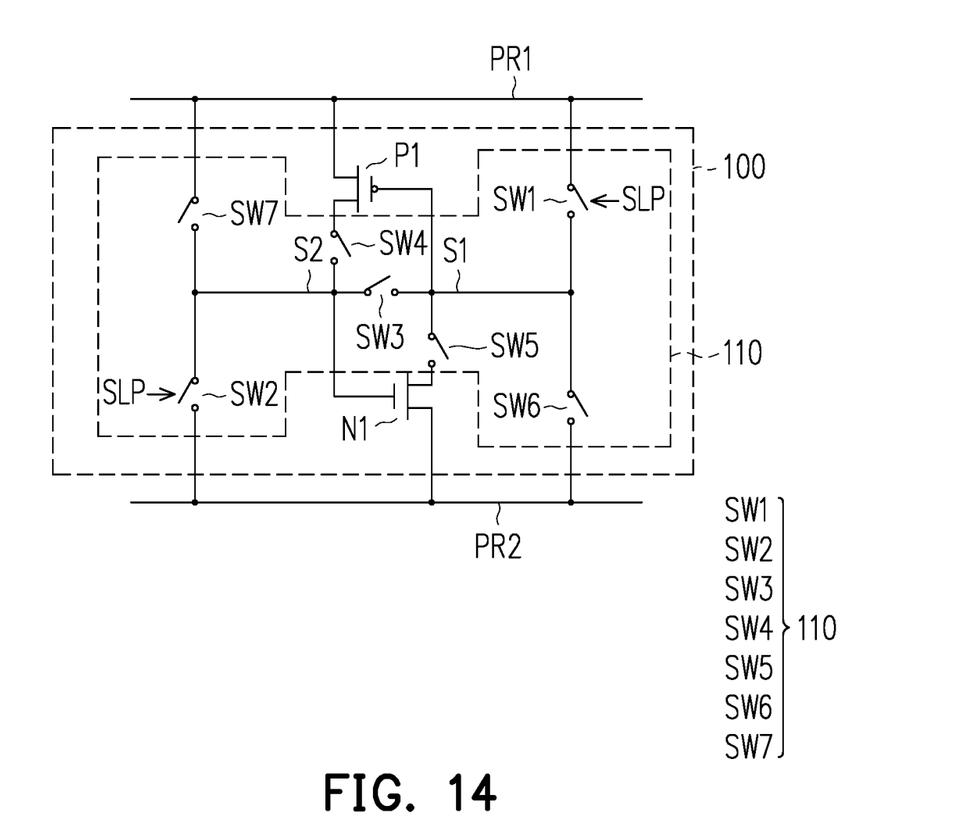
FIG. 14 is a schematic view of a circuit block of the control circuit shown by FIG. 1 according to another embodiment of the disclosure.

FIG. 14 is a schematic view of a circuit block of the control circuit 110 shown by FIG. 1 according to another embodiment of the disclosure. In the embodiment shown by FIG. 14, the control circuit 110 includes the switch SW1, the switch SW2, the switch SW3, the switch SW4, the switch SW5, the switch SW6 and the switch SW7. The switch SW1 and the switch SW2 shown in FIG. 14 can be analogized with reference to the related description of FIG. 2 or FIG. 3, the switch SW3 shown in FIG. 14 can be analogized with reference to the related description of FIG. 4 to FIG. 7 and FIG. 11 to FIG. 13, the switch SW4 and the switch SW5 shown in FIG. 14 can be analogized with reference to the related description of FIG. 8 to FIG. 13, and therefore will not be described again.

In the embodiment shown in FIG. 14, the first terminal of the switch SW6 is couple to a voltage (e.g., ground voltage VSS). The second terminal of the switch SW6 is coupled to the control terminal of the transistor P1. The first terminal of the switch SW7 is couple to a voltage (e.g., system voltage VDD). The second terminal of the switch SW7 is coupled to the control terminal of the transistor N1. The switch SW6 and the switch SW7 are turned on in the normal mode NM. The switch SW6 and the switch SW7 are turned off in the power saving mode PSM. The switch SW6 and the switch SW7 are used to pre-charge the control terminal of the transistor P1 and the control terminal of the transistor N1. When the capacitor 100 is enabled (during the normal mode NM), the switch SW6 and the switch SW7 will help the capacitor 100 to be ready faster. In other embodiments, one of switch SW6 and the switch SW7 may be omitted, depending on design requirements.

Figure 15:
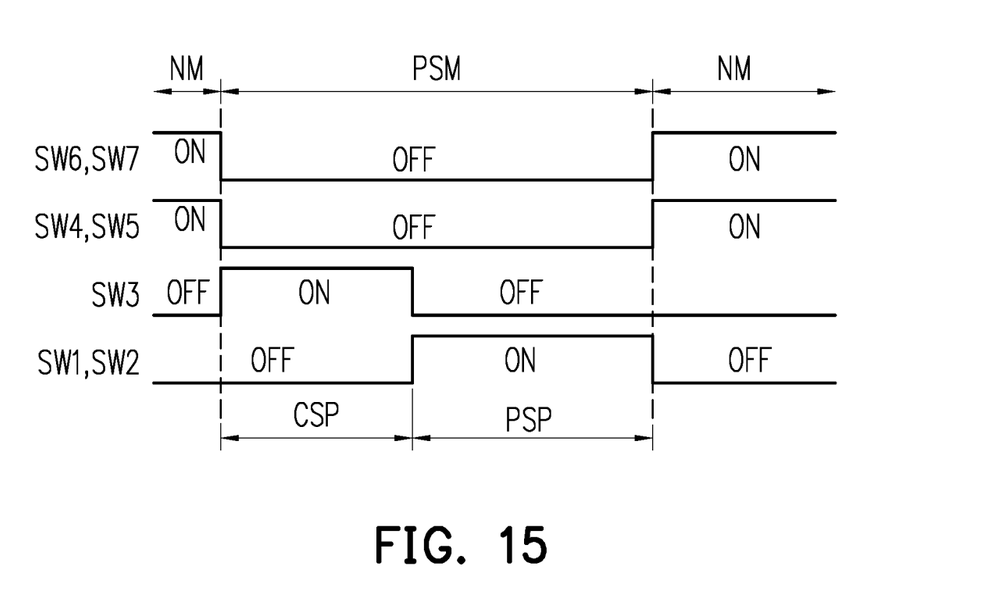
FIG. 15 is a timing diagram of the operational state of the switches illustrated in FIG. 14 according to an embodiment of the disclosure.

FIG. 15 is a timing diagram of the operational state of the switches illustrated in FIG. 14 according to an embodiment of the disclosure. The horizontal axis shown in FIG. 15 represents time, and the vertical axis represents signal level. In the normal mode NM, the switch SW1, the switch SW2 and the switch SW3 are turned off, and the switch SW4, the switch SW5, the switch SW6 and the switch SW7 are turned on. After the end of the normal mode NM, the switch SW4, the switch SW5, the switch SW6 and the switch SW7 are turned off in the power saving mode PSM. The switch SW3 is turned on and the switches SW1 and SW2 are turned off in the charge sharing period CSP of the power saving mode PSM. The switch SW1 and the switch SW2 are turned on and the switch SW3 is turned off during the power saving period PSP of the power saving mode PSM after the charge sharing period CSP.

Figure 16:
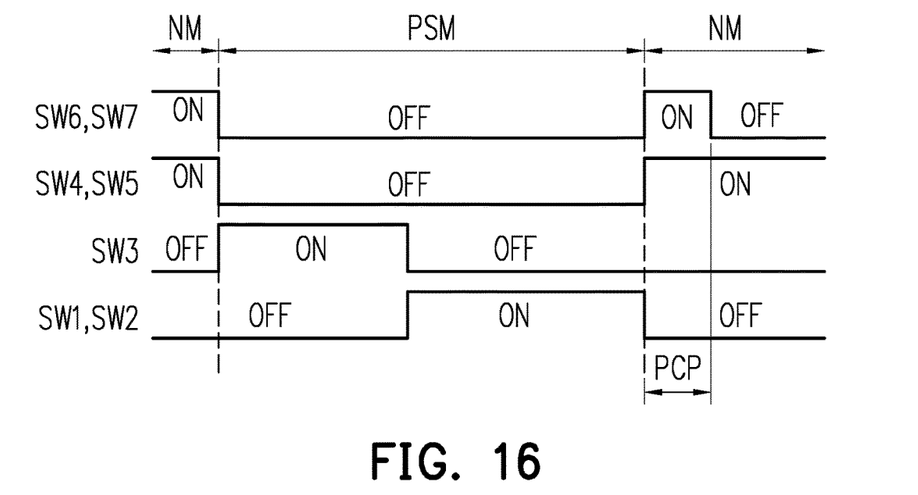
FIG. 16 is a timing diagram of the operational state of the switches illustrated in FIG. 14 according to another embodiment of the disclosure.

FIG. 16 is a timing diagram of the operational state of the switches illustrated in FIG. 14 according to another embodiment of the disclosure. The horizontal axis shown in FIG. 16 represents time, and the vertical axis represents signal level. The operation of the switches SW1, SW2, SW3, SW4 and SW5 shown in FIG. 16 can be analogized with reference to the related description of FIG. 15, and therefore will not be described again. In the embodiment shown in FIG. 16, the switch SW6 and the switch SW7 are turned off in the power saving mode PSM, the switch SW6 and the switch SW7 are turned on during a pre-charging period PCP of the normal mode NM, and the switch SW6 and the switch SW7 are turned off after the pre-charging period PCP in the normal mode NM.

Figure 17:
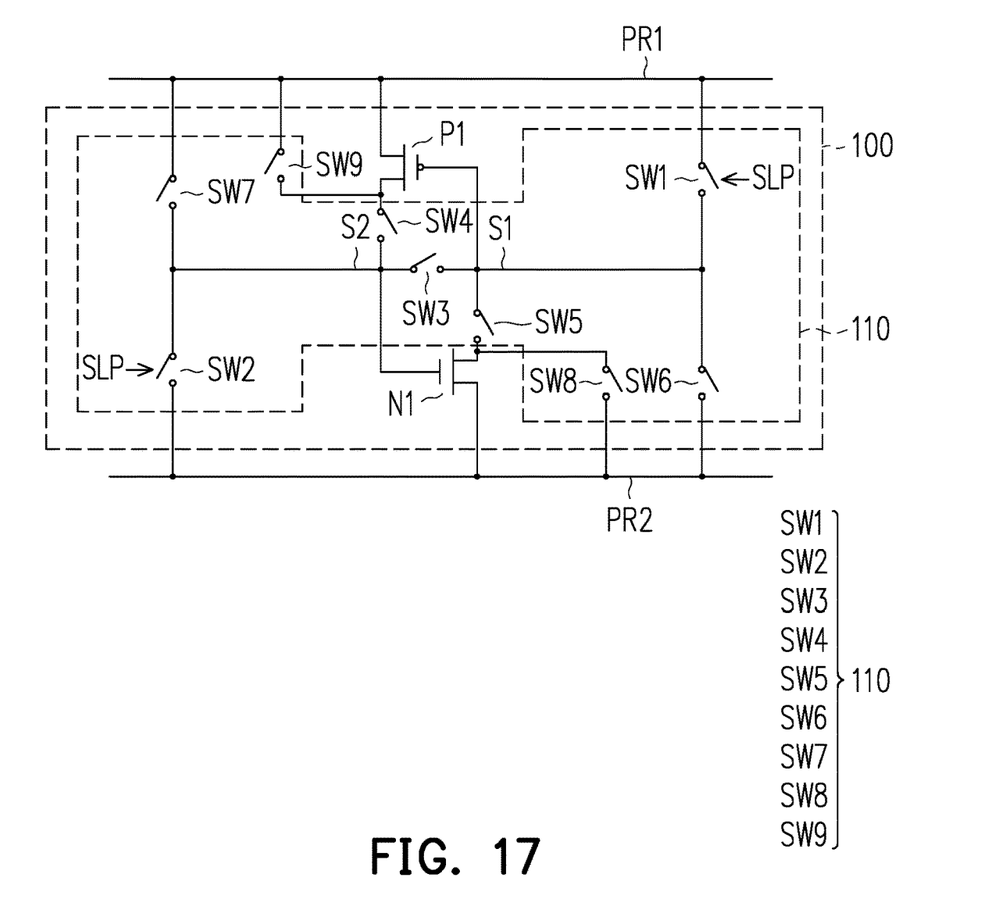
FIG. 17 is a schematic view of a circuit block of the control circuit shown by FIG. 1 according to another embodiment of the disclosure.

FIG. 17 is a schematic view of a circuit block of the control circuit 110 shown by FIG. 1 according to another embodiment of the disclosure. In the embodiment shown by FIG. 17, the control circuit 110 includes the switch SW1, the switch SW2, the switch SW3, the switch SW4, the switch SW5, the switch SW6, the switch SW7, the switch SW8 and the switch SW9. The switch SW1 and the switch SW2 shown in FIG. 17 can be analogized with reference to the related description of FIG. 2 or FIG. 3, the switch SW3 shown in FIG. 17 can be analogized with reference to the related description of FIG. 4 to FIG. 7 and FIG. 11 to FIG. 16, the switch SW4 and the switch SW5 shown in FIG. 17 can be analogized with reference to the related description of FIG. 8 to FIG. 16, the switch SW6 and the switch SW7 shown in FIG. 17 can be analogized with reference to the related description of FIG. 14 to FIG. 16, and therefore will not be described again.

In the embodiment shown in FIG. 17, the first terminal of the switch SW8 is used to couple to a voltage (e.g., ground voltage VSS). The second terminal of the switch SW8 is coupled to the second terminal of the transistor N1 and the first terminal of the switch SW5. The first terminal of the switch SW9 is used to couple to a voltage (e.g., system voltage VDD). The second terminal of the switch SW9 is coupled to the second terminal of the transistor P1 and the first terminal of the switch SW4. The switch SW8 and the switch SW9 are turned off in the normal mode NM. The switch SW8 and the switch SW9 are turned on in the power saving mode PSM. The control signal of the switch SW8 and the switch SW9 may be an inverted signal of the control signal of the switch SW4 and the switch SW5.

Figure 18:
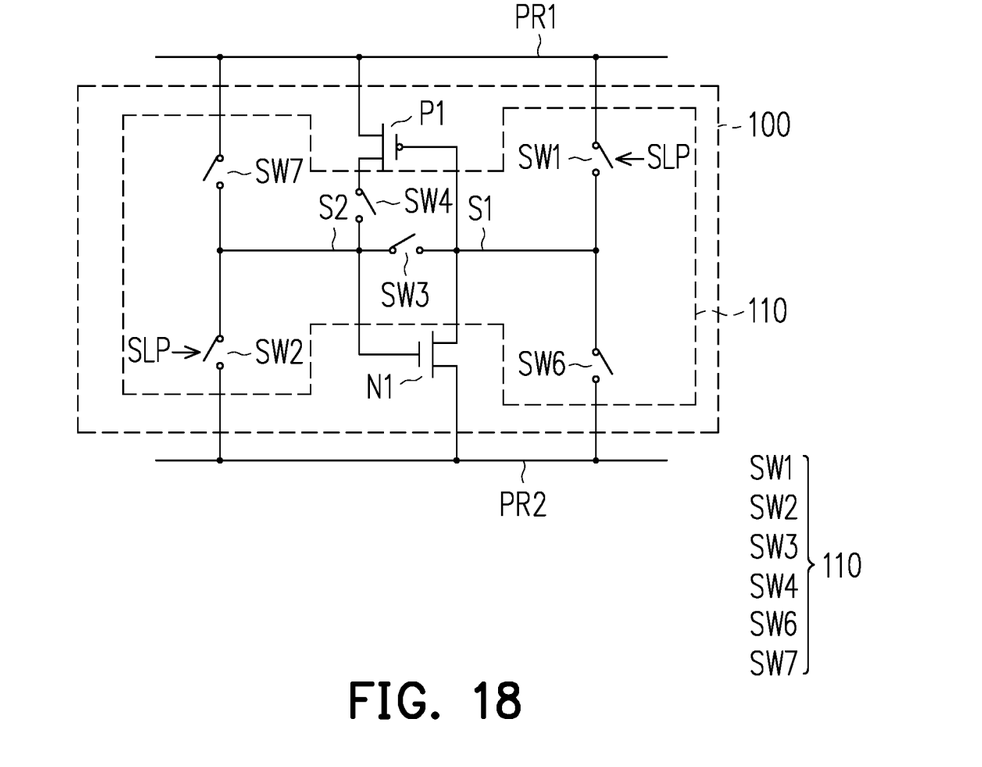
FIG. 18 is a schematic view of a circuit block of the control circuit shown by FIG. 1 according to another embodiment of the disclosure.

FIG. 18 is a schematic view of a circuit block of the control circuit 110 shown by FIG. 1 according to another embodiment of the disclosure. In the embodiment shown by FIG. 18, the control circuit 110 includes the switch SW1, the switch SW2, the switch SW3, the switch SW4, the switch SW6 and the switch SW7. The switch SW1 and the switch SW2 shown in FIG. 18 can be analogized with reference to the related description of FIG. 2 or FIG. 3, the switch SW3 shown in FIG. 18 can be analogized with reference to the related description of FIG. 4 to FIG. 7 and FIG. 11 to FIG. 16, the switch SW4 shown in FIG. 18 can be analogized with reference to the related description of FIG. 8 to FIG. 16, the switch SW7 shown in FIG. 18 can be analogized with reference to the related description of FIG. 14 to FIG. 16, and therefore will not be described again.

Figure 19:
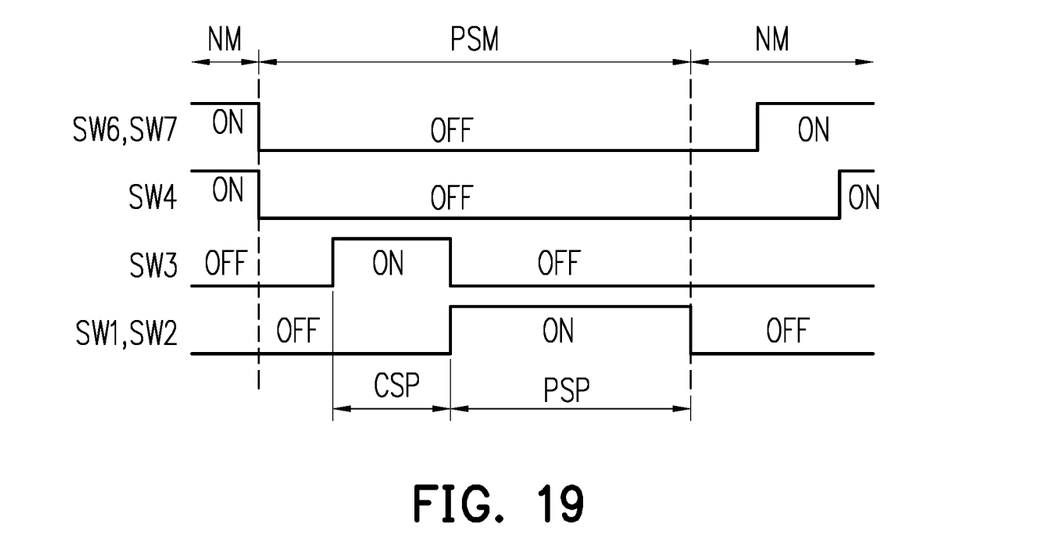
FIG. 19 is a timing diagram of the operational state of the switches illustrated in FIG. 18 according to an embodiment of the disclosure.

FIG. 19 is a timing diagram of the operational state of the switches illustrated in FIG. 18 according to an embodiment of the disclosure. The horizontal axis shown in FIG. 19 represents time, and the vertical axis represents signal level. In the normal mode NM, the switch SW1, the switch SW2 and the switch SW3 are turned off, and the switch SW4, the switch SW6 and the switch SW7 are turned on. After the end of the normal mode NM, the switch SW4, the switch SW6 and the switch SW7 are turned off in the power saving mode PSM. During that the switch SW4 is turned off, the switch SW3 is turned on in the charge sharing period CSP of the power saving mode PSM. The switch SW1 and the switch SW2 are turned on and the switch SW3 is turned off during the power saving period PSP of the power saving mode PSM after the charge sharing period CSP.

Figure 20:
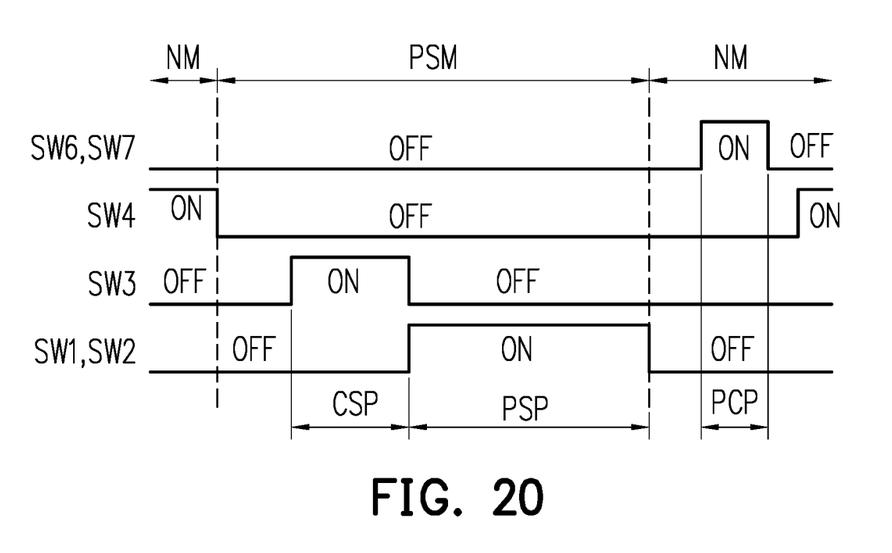
FIG. 20 is a timing diagram of the operational state of the switches illustrated in FIG. 18 according to another embodiment of the disclosure.

FIG. 20 is a timing diagram of the operational state of the switches illustrated in FIG. 18 according to another embodiment of the disclosure. The horizontal axis shown in FIG. 20 represents time, and the vertical axis represents signal level. The operation of the switches SW1, SW2, SW3 and SW4 shown in FIG. 20 can be analogized with reference to the related description of FIG. 19, and therefore will not be described again. In the embodiment shown in FIG. 20, the switch SW6 and the switch SW7 are turned off in the power saving mode PSM, the switch SW6 and the switch SW7 are turned on during a pre-charging period PCP of the normal mode NM, and the switch SW6 and the switch SW7 are turned off after the pre-charging period PCP in the normal mode NM.

In summary, in the capacitor 100 in any embodiments of the disclosure, the control terminals of the transistor P1 and transistor N1 are not directly coupled to the first and second terminals of the capacitor 100, so as to increase the protection capability to ESD. When the system is in a power saving mode, the control circuit 110 may turn off the transistor P1 and transistor N1 to reduce leakage current.

Although the disclosure has been disclosed in the above embodiments, the embodiments are not intended to limit the disclosure, and those skilled in the art may make some modifications and refinements without departing from the spirit and scope of the disclosure. Therefore, the scope of the disclosure is defined by the claims attached below.

What is claimed is:

1. A capacitor comprising:
   a first transistor having a first terminal used to couple to a first terminal of the capacitor;
   a second transistor having a first terminal used to couple to a second terminal of the capacitor; and
   a control circuit coupled between the first transistor and the second transistor, wherein the control circuit comprises:
      a first switch having a first terminal used to couple to a first voltage, wherein a second terminal of the first switch is coupled to a control terminal of the first transistor, and when the first switch is turned on, the first voltage turns off the first transistor;
      a second switch having a first terminal used to couple to a second voltage, wherein a second terminal of the second switch is coupled to a control terminal of the second transistor, and when the second switch is turned on, the second voltage turns off the second transistor;
      a third switch having a first terminal used to couple to the second voltage, wherein a second terminal of the third switch is coupled to the control terminal of the first transistor; and
      a fourth switch having a first terminal used to couple to the first voltage, wherein a second terminal of the fourth switch is coupled to the control terminal of the second transistor,
   wherein in a power saving mode, the control circuit turns off the first transistor and the second transistor; and
   wherein in a normal mode, the control circuit turns on the first transistor and the second transistor, a second terminal of the second transistor is coupled to the control terminal of the first transistor through the control circuit, and the control terminal of the second transistor is coupled to a second terminal of the first transistor through the control circuit.

2. The capacitor according claim 1, wherein the first terminal of the capacitor is used to couple to a first power rail, and the second terminal of the capacitor is used to couple to a second power rail.

3. The capacitor according to claim 1, wherein when the first transistor is one of an NMOS transistor and a PMOS transistor, the second transistor is another one of the NMOS transistor and the PMOS transistor.

4. The capacitor according to claim 1, wherein the first switch and the second switch are controlled by a sleep signal.

5. The capacitor according to claim 1, wherein the first switch comprises a PMOS transistor, the second switch comprises an NMOS transistor, and the control circuit further comprises:
   a first NOT gate having an input terminal used to receive a sleep signal, wherein an output terminal of the first NOT gate is coupled to a gate of the PMOS transistor; and
   a second NOT gate having an input terminal coupled to the output terminal of the first NOT gate, wherein an output terminal of the second NOT gate is coupled to a gate of the NMOS transistor.

6. The capacitor according to claim 1, wherein the third switch and the fourth switch are turned on in the normal mode, and the third switch and the fourth switch are turned off in the power saving mode.

7. The capacitor according to claim 1, wherein the third switch and the fourth switch are turned off in the power saving mode, the third switch and the fourth switch are turned on during a pre-charging period of the normal mode, and the third switch and the fourth switch are turned off after the pre-charging period in the normal mode.

8. A capacitor comprising:
   a first transistor having a first terminal used to couple to a first terminal of the capacitor;
   a second transistor having a first terminal used to couple to a second terminal of the capacitor; and
   a control circuit coupled between the first transistor and the second transistor,
   wherein in a power saving mode, the control circuit turns off the first transistor and the second transistor; and
   wherein in a normal mode, the control circuit turns on the first transistor and the second transistor, a second terminal of the second transistor is coupled to a control terminal of the first transistor through the control circuit, and a control terminal of the second transistor is coupled to a second terminal of the first transistor through the control circuit,
   wherein the control circuit comprises:
      a switch having a first terminal used to couple to the control terminal of the first transistor, wherein a second terminal of the switch is coupled to the control terminal of the second transistor, and the switch is turned on during a charge sharing period of the power saving mode, the first transistor and the second transistor are turned off during a power saving period of the power saving mode after the charge sharing period, and the switch is turned off in the normal mode.

9. A capacitor comprising:
   a first transistor having a first terminal used to couple to a first terminal of the capacitor;
   a second transistor having a first terminal used to couple to a second terminal of the capacitor; and
   a control circuit coupled between the first transistor and the second transistor,
   wherein in a power saving mode, the control circuit turns off the first transistor and the second transistor; and
   wherein in a normal mode, the control circuit turns on the first transistor and the second transistor, a second terminal of the second transistor is coupled to a control terminal of the first transistor through the control circuit, and a control terminal of the second transistor is coupled to a second terminal of the first transistor through the control circuit,
   wherein the control circuit comprises:
      a first switch coupled between the second terminal of the first transistor and the control terminal of the second transistor, wherein the first switch is turned on in the normal mode, and the first switch is turned off in the power saving mode.

10. The capacitor according to claim 9, wherein the control circuit further comprises:
   a second switch having a first terminal used to couple to a first voltage, wherein a second terminal of the second switch is coupled to the second terminal of the first transistor and a first terminal of the first switch, the second switch is turned off in the normal mode, and the second switch is turned on in the power saving mode.

11. A capacitor comprising:
   a first transistor having a first terminal used to couple to a first terminal of the capacitor;
   a second transistor having a first terminal used to couple to a second terminal of the capacitor; and
   a control circuit coupled between the first transistor and the second transistor,
   wherein in a power saving mode, the control circuit turns off the first transistor and the second transistor; and
   wherein in a normal mode, the control circuit turns on the first transistor and the second transistor, a second terminal of the second transistor is coupled to a control terminal of the first transistor through the control circuit, and a control terminal of the second transistor is coupled to a second terminal of the first transistor through the control circuit,
   wherein the control circuit comprises:
      a first switch coupled between the control terminal of the first transistor and the second terminal of the second transistor, wherein the first switch is turned on in the normal mode, and the first switch is turned off in the power saving mode.

12. The capacitor according to claim 11, wherein the control circuit further comprises:
   a second switch having a first terminal used to couple to a second voltage, wherein a second terminal of the second switch is coupled to the second terminal of the second transistor and a first terminal of the first switch, the second switch is turned off in the normal mode, and the second switch is turned on in the power saving mode.

* * * * *